(12) United States Patent
Yin et al.

(10) Patent No.: US 9,391,073 B2
(45) Date of Patent: Jul. 12, 2016

(54) FINFET DEVICE AND METHOD FOR MANUFACTURING THE SAME

(71) Applicant: INSTITUTE OF MICROELECTRONICS, CHINESE ACADEMY OF SCIENCES, Beijing (CN)

(72) Inventors: Huaxiang Yin, Beijing (CN); Xiaolong Ma, Beijing (CN); Weijia Xu, Beijing (CN); Qiuxia Xu, Beijing (CN); Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 14/397,822

(22) PCT Filed: Aug. 6, 2013

(86) PCT No.: PCT/CN2013/080887
§ 371 (c)(1),
(2) Date: Oct. 29, 2014

(87) PCT Pub. No.: WO2015/000204
PCT Pub. Date: Jan. 8, 2015

(65) Prior Publication Data
US 2015/0311200 A1    Oct. 29, 2015

(30) Foreign Application Priority Data

Jul. 2, 2013    (CN) .......................... 2013 1 0275191

(51) Int. Cl.
*H01L 21/00* (2006.01)
*H01L 27/00* (2006.01)
*H01L 29/00* (2006.01)
*H01L 27/088* (2006.01)
*H01L 29/66* (2006.01)
*H01L 29/78* (2006.01)
*H01L 21/306* (2006.01)
*H01L 21/8234* (2006.01)

(52) U.S. Cl.
CPC ...... *H01L 27/0886* (2013.01); *H01L 21/30604* (2013.01); *H01L 29/66795* (2013.01); *H01L 29/7853* (2013.01); *H01L 29/7854* (2013.01); *H01L 21/823431* (2013.01)

(58) Field of Classification Search
CPC ............ H01L 27/0886; H01L 27/0924; H01L 27/1211; H01L 29/7854; H01L 29/66795; H01L 29/785; H01L 21/823431; H01L 21/30604; H01L 21/823821
See application file for complete search history.

(56) References Cited

U.S. PATENT DOCUMENTS 8,264,032 B2 *    9/2012    Yeh .................. H01L 29/66795
                                                                 257/327

(Continued)

FOREIGN PATENT DOCUMENTS

| CN | 102820334 A | 12/2012 | |
|---|---|---|---|
| JP | 2009-027085 A | 5/2009 | |
| WO | WO2013/101219 | * 7/2013 | .............. H01L 29/78 |

*Primary Examiner* — Nikolay Yushin
(74) *Attorney, Agent, or Firm* — Christensen Fonder P.A.

(57) ABSTRACT

A FinFET device and a method for manufacturing the same. The FinFET device includes a plurality of fins each extending in a first direction on a substrate; a plurality of gate stacks each being disposed astride the plurality of fins and extending in a second direction; a plurality of source/drain region pairs, respective source/drain regions of each source/drain region pair being disposed on opposite sides of the each gate stack in the second direction; and a plurality of channel regions each comprising a portion of a corresponding fin between the respective source/drain regions of a corresponding source/drain pair, wherein the each fin comprises a plurality of protruding cells on opposite side surfaces in the second direction.

9 Claims, 3 Drawing Sheets

(56) References Cited

U.S. PATENT DOCUMENTS

| | | |
|---|---|---|
| 2008/0274600 A1 | 11/2008 | Mathew et al. |
| 2009/0026522 A1 | 1/2009 | Ananthan |
| 2009/0283829 A1 | 11/2009 | Dyer et al. |
| 2011/0049613 A1* | 3/2011 | Yeh .................. H01L 29/66795 257/327 |
| 2013/0026571 A1 | 1/2013 | Kawa et al. |
| 2014/0159159 A1* | 6/2014 | Steigerwald ...... H01L 29/66795 257/369 |

* cited by examiner

FINFET DEVICE AND METHOD FOR MANUFACTURING THE SAME

CROSS-REFERENCE TO RELATED APPLICATION(S)

This application is a National Phase application of, and claims priority to, PCT Application No. PCT/CN2013/080887, filed on Aug. 6, 2013, entitled "FINFET DEVICE AND METHOD FOR MANUFACTURING THE SAME", which claimed priority to Chinese Application No. 201310275191.8, filed on Jul. 2, 2013. Both the PCT Application and Chinese Application are incorporated herein by reference in their entireties.

TECHNICAL FIELD

The present disclosure relates to a semiconductor device and a method for manufacturing the same. In particular, the present disclosure relates to a FinFET device having a surface that comprises continuous protruding cells and a method for manufacturing the same.

BACKGROUND

Three-dimensional multi-gate devices, e.g., FinFETs or Tri-gate devices, are main-stream devices in current sub-20 nm technology. Such devices can effectively improve gate control capability and meanwhile suppress current leakage and Short Channel Effect (SCE).

For example, compared with a conventional single-gate bulk Si or SOI MOSFET, a dual-gate SOI MOSFET can suppress the SCE and Drain Induced Barrier Lowering (DIBL) effect more effectively. It also has a lower junction capacitance and is suitable for light channel doping. The dual-gate SOI MOSFET may have a threshold voltage adjustable by setting a work function of its metal gate, thereby obtaining a drive current of about two times larger than that of the conventional single-gate bulk Si or SOI MOSFET. This allows relaxation of a requirement on Effective Oxide Thickness (EOT). The tri-gate device has a gate covering a top surface and two side surfaces of a channel region of the device, which enables stronger gate-control capability than that of the dual-gate device. Gate-all-around nanowire multi-gate devices may have more advantages.

The gate-all-around nanowire device may have better gate-control capability and may suppress the SCE more effectively, thus exhibiting more advantages in size-reduction of sub-14 nm technology. However, it cannot provide greater drive current in an equivalent silicon plane area.

For example, for a device having an equivalent line-width of 1 μm, the gate-all-around nanowire device should have dimensions satisfying $d*n+(n-1)*s=1$ μm and $\pi*d*n>1$ μm, wherein d represents a diameter of a single nanowire, n represents a number of the nanowires, and s represents a pitch, i.e., distance, between two adjacent nanowires. For the diameter d being 3 nm, 5 nm, 7 nm, and 10 nm, s should be smaller than 6.4 nm, 10.6 nm, 15 nm, and 21.4 nm, respectively. That is, the lateral arrangement of the nanowire device should be very compact in order to obtain a gate width equivalent to a gate width of 1 μm of a bulk silicon device. Existing FinFET exposure and etching technology enables a pitch of about 60 nm between two adjacent fins, which is difficult to implement a three-dimensional arrangement of nanowires with a very small pitch.

An effective way to improve the drive current of a transistor is to implement a stack of gate-all-around nanowire structures in a perpendicular direction. However, the process or manufacturing method for such a structure is very difficult. Great challenge exists in compatibility with conventional processes and also in cost reduction. For example, an existing method comprises Si/SiGe multilayer hetero-epitaxy and selective etching. That is, a plurality of Si/SiGe stacks are hetero-epitaxially grown alternatively on a buried oxide (BOX) layer. Then SiGe layers are removed selectively by, e.g., wet etching, to obtain a stack of Si nanowires. This method is limited to quality of epitaxial layers and is high in cost. On the other hand, in a unit footprint area, a nanowire stack of a conventional structure, in which each nanowire is surrounded by a HK/MG gate stack, has a small effective overall current. In the same projection area, a fin of non-stacked nanowires has a larger conductive effective cross-section, which is perpendicular to an extension direction of the fin or nanowires, i.e., to a channel direction.

Therefore, it is desired to find a device structure that can increase an effective width of a conductive channel and the drive current as well as a method for manufacturing the same.

SUMMARY

The present disclosure intends to provide a device structure that can increase an effective width of a conductive channel and a drive current as well as a method for manufacturing the same.

The present disclosure provides a method for manufacturing a FinFET device, comprising: forming a plurality of fins on a substrate, each fin extending in a first direction; forming a plurality of protruding cells on opposite side surfaces of each fin in a second direction; forming at least one gate stack astride the plurality of fins, each gate stack extending in the second direction; and forming a pair of source/drain regions in each fin on opposite sides of the each gate stack, wherein a portion of each fin between the source/drain regions form a channel region.

Optionally, the plurality of protruding cells may be formed by performing dry etching and/or wet etching on the side surfaces of the each fin.

Optionally, process parameters of the dry etching and/or wet etching may be controlled such that the plurality of protruding cells each have a cross-section shape selected from a group consisting of rectangle, triangle, trapezoid, reversed trapezoid, Σ-shape, C-shape, D-shape, circle, ellipse, sector, and diamond, or any combinations thereof.

Optionally, the plurality of protruding cells may be periodic, and/or continuous, and/or discrete.

Optionally, the dry etching may comprise isotropic plasma dry etching or reactive ion etching having a lateral etching depth or a combination of isotropic dry etching and anisotropic dry etching.

Optionally, the wet etching may comprise selective wet etching having different etching rates in different crystal orientations.

Optionally, the method may further comprise performing surface treatment and rounding process on the side surfaces of the each fin after the plurality of protruding cells are formed.

The present disclosure further provides a FinFET device, comprising: a plurality of fins each extending in a first direction on a substrate; a plurality of gate stacks each being disposed astride the plurality of fins and extending in a second direction; a plurality of source/drain region pairs, respective source/drain regions of each source/drain region pair being disposed on opposite sides of the each gate stack in the second direction; and a plurality of channel regions each comprising a portion of a corresponding fin between the respective source/drain regions of a corresponding source/drain pair, wherein the each fin comprises a plurality of protruding cells on opposite side surfaces in the second direction.

Optionally, the plurality of protruding cells each may have a cross-section shape selected from a group consisting of rectangle, triangle, trapezoid, reversed trapezoid, Σ-shape, C-shape, D-shape, circle, ellipse, sector, and diamond, or any combinations thereof.

Optionally, the plurality of protruding cells may be periodic, and/or continuous, and/or discrete.

Optionally, the plurality of protruding cells each may have a height/thickness smaller than 5% of a thickness/width of the each fin.

According to the FinFET device and the manufacturing method thereof provided in the present disclosure, the continuous protruding cells, e.g., each having an arc surface, are formed on the opposite side surfaces of the fins to increase the capability of suppressing the SCE. Meanwhile, an overall effective conductive cross-section area of the channel is increased for a same planar projection area, thereby improving overall performance of the device.

BRIEF DESCRIPTION OF THE DRAWINGS

The present disclosure will be described with reference to the accompanying drawings, in which.

DETAILED DESCRIPTION

Next, features and technical effects of the present disclosure will be explained in detail in connection with exemplary embodiments with reference to accompanying drawings. The present disclosure provides a FinFET device and a method for manufacturing the same, which can effectively increase an effective width of a conductive channel, thereby improving a drive current. In the following description, similar parts are represented by the same or similar reference signs. Terms "first," "second," "top," and "bottom," etc., as used hereinafter, may be indicative of various device structures or process steps. These terms do not intend to specify any particular spatial, sequential, or hierarchical relationships between such device structures or process steps.

Figure 8:
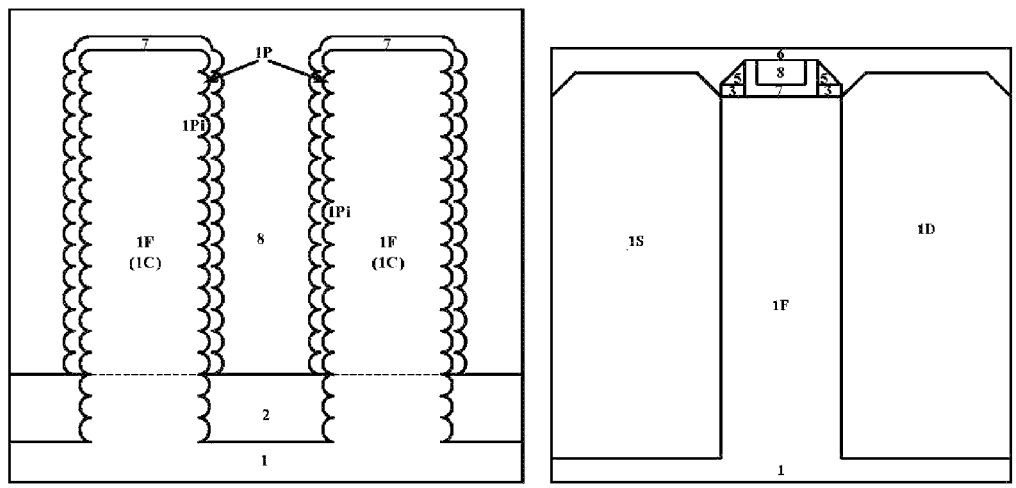
Figure 9:
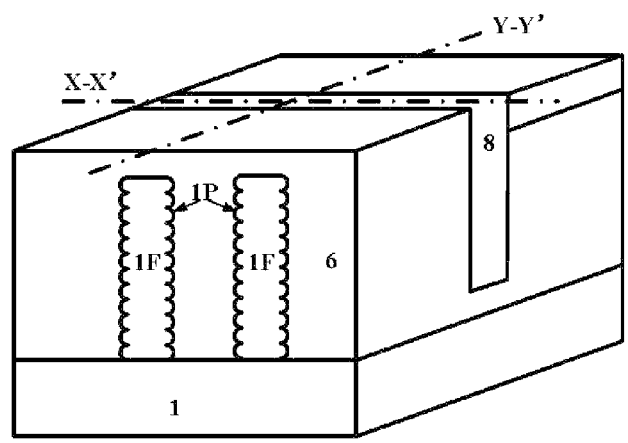
FIG. 9 schematically shows a perspective view of a FinFET device according to an embodiment of the present disclosure.

FIG. 9 schematically shows a perspective view of a FinFET device manufactured according to an embodiment of the present disclosure. The FinFET device comprises a plurality of fins each extending in a first direction on a substrate, a plurality of gate stacks each being disposed astride the plurality of fins and extending in a second direction, and a plurality of source/drain regions on opposite sides of the plurality of fins. A portion of each fin between two corresponding source/drain regions forms a channel region. The fins each have continuous protruding cells on opposite side surfaces in the second direction. The protruding cells may each have an arc surface, for example. Next, cross-sectional views of structures obtained in respective steps of a method for manufacturing the FinFET device as shown in FIG. 9 will be illustrated with reference to FIGS. 1-8. Then the device structure will be explained in more detail with reference to FIG. 9.

In each figure of FIGS. 1-8, a left portion shows a cross-sectional view perpendicular to a channel direction of FIG. 9, i.e., the cross-section view is along an X-X' direction shown in FIG. 9 (also referred to as "second direction"). A right portion of each figure shows a cross-sectional view along the channel direction of FIG. 9, i.e., the cross-section view is along an X-X' direction shown in FIG. 9 (also referred to as "first direction").

Figure 1:
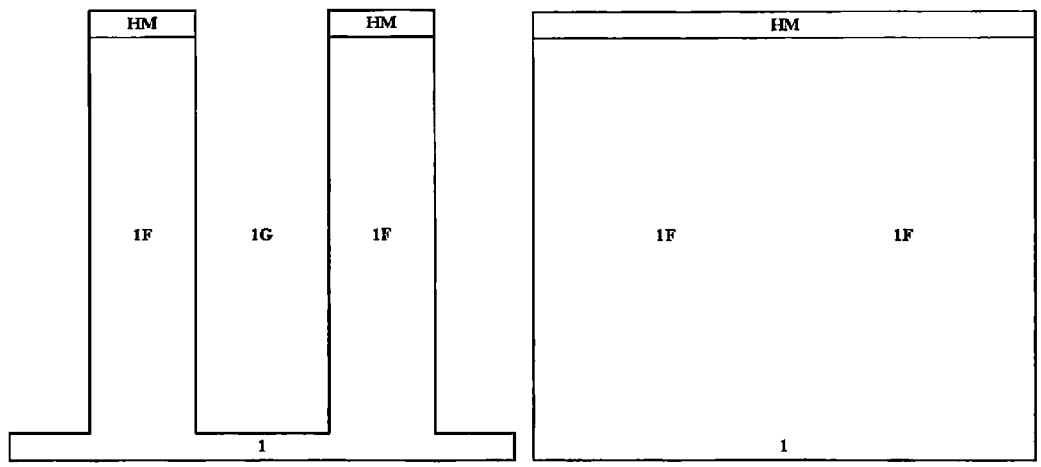
FIGS. 1-8 schematically show cross-sectional views of structures obtained in respective steps of a method for manufacturing a FinFET device according to an embodiment of the present disclosure.

As shown in FIG. 1, a plurality of fins are formed on a substrate 1, each fin extending in a first direction, i.e., the Y-Y' direction in FIG. 9. A channel region to be formed later also extends in the first direction. The substrate 1 may comprise any material selected from a group consisting of monocrystal bulk Si, monocrystal bulk Ge, Strained Si, and SiGe. Alternatively, the substrate 1 may comprise a compound semiconductor material such as any material selected from a group consisting of GaN, GaAs, InP, and InSb. Alternatively, the substrate 1 may comprise a carbon-based semiconductor material such as any material selected from a group consisting of graphene, SiC, and carbon nanotube, etc. The substrate 1 may comprise bulk Si for compatibility with a CMOS process. A plurality of grooves 1G are formed in the substrate 1 by photolithography/etching of the substrate 1, the grooves 1G extending in parallel with respect to each other along the first direction. The remaining material of the substrate 1 between the grooves 1G forms a plurality of fins 1F. The grooves 1G each may have an aspect ratio, i.e., a ratio between its depth and width, of greater than 5:1. Optionally, a hard-mask layer HM may be deposited on a top of each fin. The hard-mask layer HM may comprise any material selected from a group consisting of silicon oxide, silicon nitride, and silicon oxynitride, or any combinations thereof. In an embodiment, the hard-mask layer may comprise silicon nitride.

Figure 2:
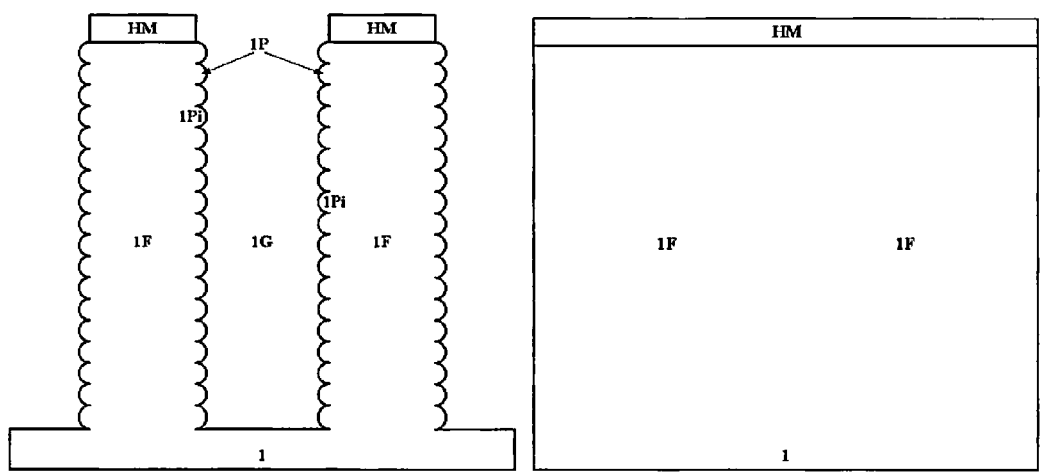

As shown in FIG. 2, a protruding portion 1P is formed on each of two opposite side surfaces of each fin 1F by etching the fin in a second direction perpendicular to the first direction. Optionally, the side surfaces of each fin 1F is etched laterally in the second direction, i.e., the X-X' direction in FIG. 9, using the hard-mask layer HM as a mask by dry or wet etching to form the protruding portions 1P at the side surfaces of each fin 1F. The protruding portions 1P may protrude outwardly in a direction from inside the fin 1F toward the surface thereof. The protruding portions 1P may each comprise a plurality of similar or identical protruding cells 1Pi, which are disposed periodically or discretely. Each fin 1F may be etched by isotropic F-based or Cl-based plasma dry etching or TMAH wet etching. Process parameters such as etching temperature may be selected to achieve a desired etching profile. In an embodiment, the dry etching may comprise isotropic plasma dry etching having a lateral etching depth or a combination of isotropic dry etching and anisotropic dry etching, and the wet etching may comprise selective wet etching having different etching rates in different crystal orientations. Optionally, the etching process may be Reactive Ion Etching (RIE) using F-based or Cl-based etching gas such as any one selected from a group consisting of $NF_3$, $SF_6$, $CF_4$, $CH_2F_2$, $CH_3F$, $CHF_3$, and $Cl_2$, or any combinations thereof. The protruding cell 1Pi may have any cross-section shape selected from a group consisting of rectangle, triangle, trapezoid, reversed trapezoid, Σ-shape, C-shape, D-shape, circle, ellipse, sector, diamond, and any other polygon or arc-shape by controlling the etching parameters. The Σ-shape may comprise a plurality of line segments connected in sequence. The C-shape may comprise more than a half of an arc, which may include a circle, an ellipse, or a hyperboloid shape. The D-shape may comprise a half of an arc shape, which may include the circle, the ellipse, or the hyperboloid. In an embodiment of the present disclosure, the protruding portion 1P may have a cross-section shape comprising a plurality of continuous arc-shapes. The arc-shapes each may be selected from a group consisting of a semi-circle, an ellipse, and a sector. Such a cross-section shape can improve uniformity of the electric field in the channel region of the fin, thereby improving reliability of the device. In another embodiment of the present disclosure, the protruding portion 1P may have a cross-section shape comprising a plurality of periodic triangles or trapezoids, which implement a continuous rough surface of the protruding portion 1P. Alternatively, the protruding portion 1P may have a composite surface, which is a periodic combination of smooth surfaces and rough surfaces. Alternatively, the protruding portion 1P may have a surface comprising discrete different protruding cells. That is, the protruding cells 1Pi may be periodic, continuous, or discrete. The protruding cells 1Pi may each have a height/thickness smaller than 5% of a thickness/width of the fin 1F. For example, the height/thickness of the protruding cell 1Pi may be 1~5 nm. In an embodiment, the protruding portion 1P comprises continuous protruding cells 1Pi to achieve uniform electrical performance of the channel.

Optionally, the protruding portions 1P are rounded by surface treatment or rounding process to obtain smooth surfaces. For example, the protruding portions 1P may be subjected to surface oxidation, which may comprise furnace-temperature oxidation or oxidation using strong oxidant, etc., followed by wet micro-etching. The surface treatment and rounding process may comprise high-temperature baking in $H_2$ gas or isotropic etching of Si, etc.

Figure 3:
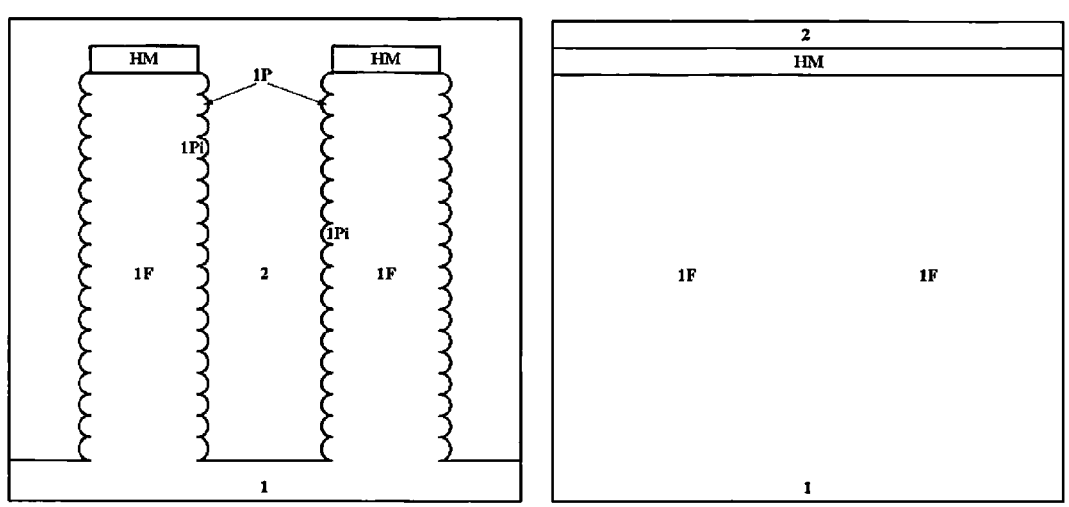

As shown in FIG. 3, an insulating dielectric layer is formed by filling a dielectric material, such as any one selected from a group consisting of silicon oxide, silicon oxynitride, silicon-carbon oxide, and low-k dielectric material, etc., in the groove 1G between the fins 1F to form a Shallow Trench Isolation (STI) 2 by PECVD, HDPCVD, RTO (Rapid Thermal Oxidation), etc. Optionally, the STI 2 is planarized by CMP or etching back to expose the hard-mask layer HM.

Figure 4:
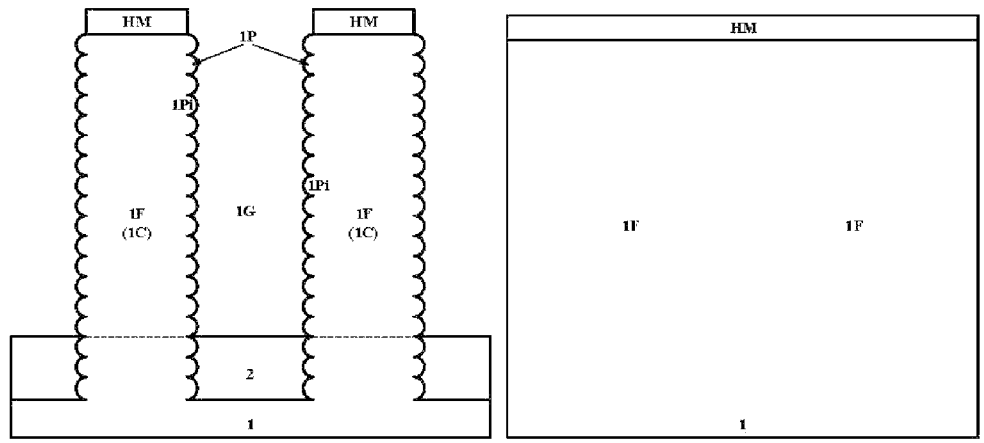

As shown in FIG. 4, the STI 2 is etched back to expose a majority of each of the fins 1F. For example, only a bottom portion of each fin 1F, which may occupy 1/10~1/5 of a total height of the fin 1F, remains inside the STI 2. The STI 2, if comprising silicon oxide, may be etched back by HF-based wet etching or F-based plasma dry etching to expose a majority portion of each fin 1F. The exposed portion of each fin will be used for formation of a channel region. The bottom of each fin will be used as an isolation region. Optionally, the hard-mask layer HM is then removed by wet etching.

Figure 5:
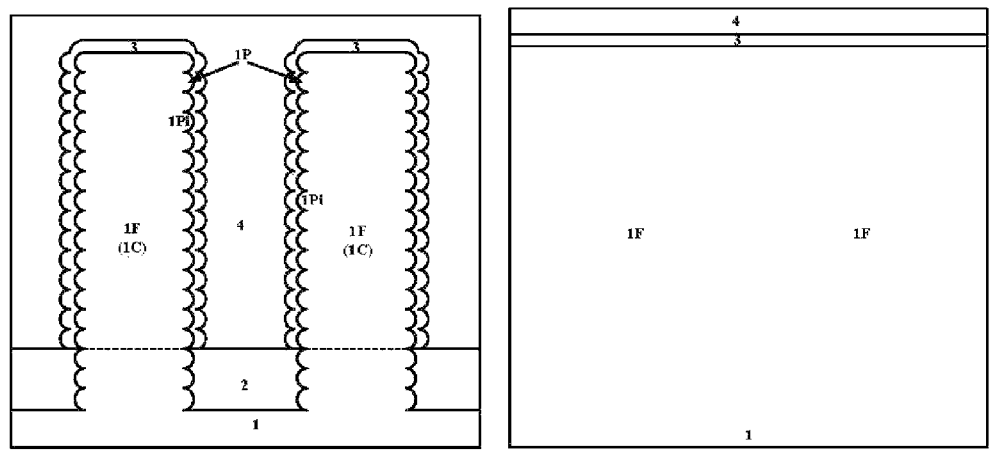

As shown in FIG. 5, sacrificial gate stack layers are filled in the re-exposed groove 1G between the fins 1F. First, a protection oxide layer 3 comprising silicon oxide is formed on the STI 2 and the fins 1F by LPCVD, PECVD, HDPCVD, RTO, or chemical oxidation. The protection oxide layer 3 is used to protect the fins 1F from being over-etched in later etching process. A sacrificial gate layer 4 is formed on the protection oxide layer 3 by PECVD, HDPCVD, MOCVD, MBE, ALD, evaporation, or sputtering, etc. The sacrificial gate layer 4 may comprise any material selected from a group consisting of polysilicon, amorphous silicon, microcrystalline silicon, amorphous carbon, polycrystalline germanium, and amorphous germanium, or any combinations thereof. Thicknesses of the respective layers are not necessarily as shown in the figures but can be set according to specific device dimensions and electrical performance requirements. In an example, the sacrificial gate stack layers 3 and 4 surround a top portion of the fins and side surfaces of the protruding portions 1P.

Figure 6:
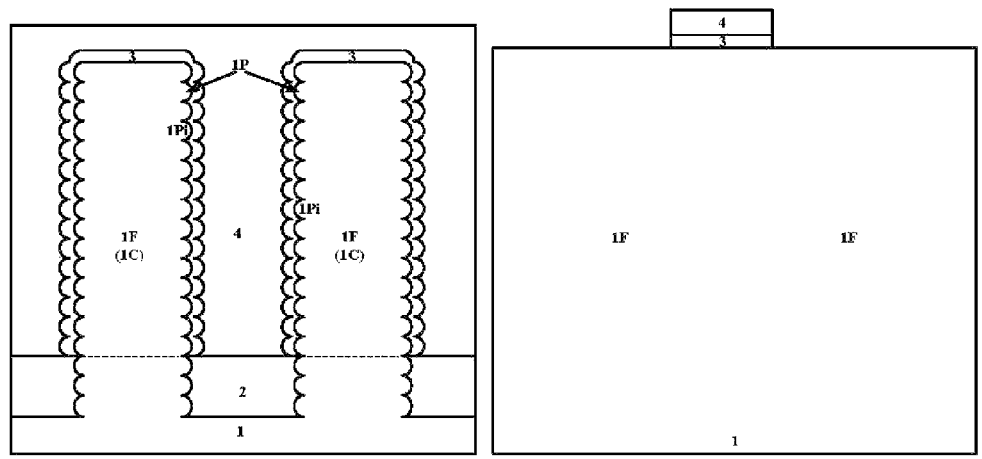

As shown in FIG. 6, the sacrificial gate stack layers 3 and 4 are etched to form a sacrificial gate stack astride the fins 1F extending in the second direction. For example, portions of the layers 3 and 4 are removed on opposite sides of each fin 1F in the first direction by etching the layers 3 and 4 to expose the top of the fins 1F using a known patterning method. As shown in FIG. 6, the sacrificial gate stack remains only on the fins 1F. It should be noted that, although not shown, there may be more than one sacrificial gate stack.

Figure 7:
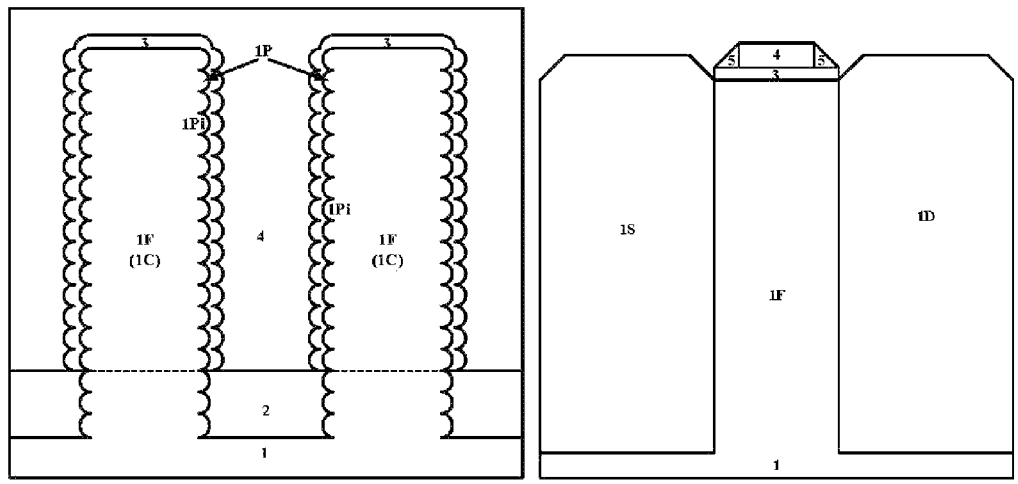

As shown in FIG. 7, a pair of source/drain regions 1S/1D are formed on the opposite sides of each fin 1F in the first direction. In an embodiment of the present disclosure, the fins 1F are etched to expose the substrate 1. Then raised source/drain regions 1S and 1D are formed by selective epitaxy such as UHVCVD, MOCVD, ALD, MBE, or constant-pressure epitaxy. The source/drain regions may comprise the same material as that of the substrate 1, such as Si. Alternatively, for a PMOS device, the source/drain regions may comprise any material selected from a group consisting of SiGe, SiSn, GeSn, and Si, or any combinations thereof, thereby exerting compressive stress to the channel region 1C to increase cavity mobility. For an NMOS device, the source/drain regions may comprise any material selected from a group consisting of Si:C, Si:H, SiGe:C, and Si, etc., or any combinations thereof, thereby exerting tensile stress to the channel region 1C to increase electron mobility. Optionally, in-situ doping may be performed simultaneously with the epitaxy or dopants may be implanted after the epitaxy and then annealing is performed. In this way, the source/drain regions 1S/D may have a dopant type and concentration different from that of the substrate 1, thereby controlling electrical performances of the device. The source/drain regions 1S/D may each have a top higher than that of the each fin 1F. Optionally, spacers 5 may be formed on opposite surfaces of the each fin 1F in the first direction. The spacers 5 may then be used to form lightly-doped source/drain extension regions and heavily-doped source/drain regions (not shown).

As shown in FIG. 8, a Gate-Last process is then performed. An interlayer dielectric layer (ILD) 6 is formed on the whole structure. Then the sacrificial gate stack layers 3 and 4 are removed by wet etching to leave a gate groove (not shown) in the ILD 6. A gate insulating layer 7 comprising a high-K material and a gate conductive layer 8 comprising a metal material are deposited in the gate groove in sequence to form a gate stack. The gate stack is planarized by CMP to expose the ILD 6. Then source/drain contact holes (not shown) are formed by etching the ILD 6 until the source/drain regions 1S/D are exposed. A blocking layer comprising metal nitride and a conductive layer comprising a metal material are deposited in each of the source/drain contact holes to form source/drain plugs (not shown).

FIG. 9 shows a perspective view of the FinFET device. The FinFET device comprises: a plurality of fins on a substrate, each fin extending in a first direction; a plurality of gate stacks each being astride the plurality of fins and extending in a second direction; a plurality of source/drain region pairs, respective source/drain regions of each source/drain region pair being disposed on opposite sides of each gate stack in the second direction; and a plurality of channel regions each being formed from a portion of a corresponding fin between the respective source/drain regions of a corresponding source/drain region pair. Each fin comprises a plurality of protruding cells on opposite side surfaces in the second direction. The protruding cells 1Pi may each have any cross-section shape selected from a group consisting of rectangle, triangle, trapezoid, reversed trapezoid, Σ-shape, C-shape, D-shape, circle, ellipse, sector, diamond, and any other polygon or arc-shape by controlling the etching parameters. The Σ-shape may comprise a plurality of line segments connected in sequence. The C-shape may comprise more than a half of an arc shape, which may include a circle, an ellipse, or a hyperboloid. The D-shape may comprise a half of an arc shape, which may include the circle, the ellipse, or the hyperboloid. The plurality of protruding cells may be periodic or discrete. Specific materials and shapes of the foregoing structures have been illustrated in detail in the above description, so detailed explanation thereof is omitted.

According to the FinFET device and the manufacturing method thereof provided in the present disclosure, the continuous protruding cells, e.g., each having an arc surface, are formed on the opposite side surfaces of the fins to increase the capability of suppressing the SCE. Meanwhile, an overall effective conductive cross-section area of the channel is increased for a same planar projection area, thereby improving overall performance of the device.

The present disclosure has been explained in connection with one or more exemplary embodiments. Various changes and equivalents of the device structure will be obvious to those skilled in the art without departing from the scope of the present disclosure. Also, various modifications may be made for particular circumstances or materials in light of the teaching of the present disclosure. The present disclosure is not limited to the specific embodiments. To the contrary, the device structure and the method for manufacturing the same according to the present disclosure should cover every embodiment thereof.

We claim:

1. A method for manufacturing a FinFET device, comprising:
   forming a plurality of fins on a substrate, each of the plurality of fins extending in a first direction;
   forming a plurality of protruding cells on opposite side surfaces of each fin in a second direction by performing dry etching and/or wet etching on the side surfaces of each fin;
   forming at least one gate stack astride the plurality of fins, each gate stack extending in the second direction; and
   forming a pair of source/drain regions in each fin on opposite sides of each gate stack, wherein a portion of each fin between the source/drain regions form a channel region.

2. The method according to claim 1, wherein process parameters of the dry etching and/or wet etching are controlled such that the plurality of protruding cells each have a cross-section shape selected from a group consisting of a rectangle, triangle, trapezoid, reversed trapezoid, Z-shape, C-shape, D-shape, circle, ellipse, sector, and diamond, or any combination thereof.

3. The method according to claim 1, wherein the plurality of protruding cells are periodic, and/or continuous, and/or discrete.

4. The method according to claim 1, wherein the dry etching comprises isotropic plasma dry etching or reactive ion etching having a lateral etching depth or a combination of isotropic dry etching and anisotropic dry etching.

5. The method according to claim 1, wherein the wet etching comprises selective wet etching having different etching rates in different crystal orientations.

6. The method according to claim 1, further comprising performing surface treatment and rounding process on the side surfaces of each fin after the plurality of protruding cells are formed.

7. A FinFET device, comprising:
   a plurality of fins each extending in a first direction on a substrate;
   a plurality of gate stacks each being disposed astride the plurality of fins and extending in a second direction;
   a plurality of source/drain region pairs, respective source/drain regions of each source/drain region pair being disposed on opposite sides of each gate stack in the second direction; and
   a plurality of channel regions each comprising a portion of a corresponding fin between the respective source/drain regions of a corresponding source/drain pair,
   wherein each fin comprises a plurality of similar or identical protruding cells on opposite side surfaces in the second direction which protrude outwardly in a direction from inside the fin toward the surface thereof and formed by performing dry etching and/or wet etching on the side surfaces of each fin.

8. The FinFET device according to claim 7, wherein the plurality of protruding cells each have a cross-section shape selected from a group consisting of a rectangle, triangle, trapezoid, reversed trapezoid, Σ-shape, C-shape, D-shape, circle, ellipse, sector, and diamond, or any combination thereof.

9. The FinFET device according to claim 7, wherein the plurality of protruding cells are periodic, and/or continuous, and/or discrete.

* * * * *